United States Patent [19]

Waehner

[11] 4,176,300
[45] Nov. 27, 1979

[54] DEFLECTION WAVEFORM GENERATOR

[75] Inventor: Glenn C. Waehner, Riverside, Conn.

[73] Assignee: United Technologies Corporation, Hartford, Conn.

[21] Appl. No.: 926,691

[22] Filed: Jul. 21, 1978

Related U.S. Application Data

[63] Continuation of Ser. No. 779,643, Mar. 21, 1977, abandoned.

[51] Int. Cl.$^2$ .............................................. H01J 29/70
[52] U.S. Cl. ..................................... 315/371; 315/388; 315/389
[58] Field of Search ......................... 315/371, 388, 389

[56] References Cited

U.S. PATENT DOCUMENTS

| | | | |
|---|---|---|---|
| 3,098,171 | 7/1963 | Ashley | 315/389 |
| 3,725,726 | 4/1973 | West | 307/228 |
| 3,890,542 | 6/1975 | Zimmermann | 315/389 |
| 3,986,077 | 10/1976 | Araz | 315/389 |

Primary Examiner—Malcolm F. Hubler
Attorney, Agent, or Firm—Richard P. Lange

[57] ABSTRACT

A deflection waveform generator uses a low voltage accurate capacitor to integrate the yoke deflection current and derive a parabolic waveform for "S" correcting the basic sawtooth deflection waveform. This parabolic waveform is fed back to the inverting input of a balanced operational integrating amplifier, the inverting input also having the integrating network coupled thereto. The polarities of the signal waveforms at the inverting input are such that the combined signal fed through the integrating network creates a "S" corrected sawtooth yoke deflection current which drives the electron beam in a manner which compensates geometric distortion inherent in the CRT.

4 Claims, 1 Drawing Figure

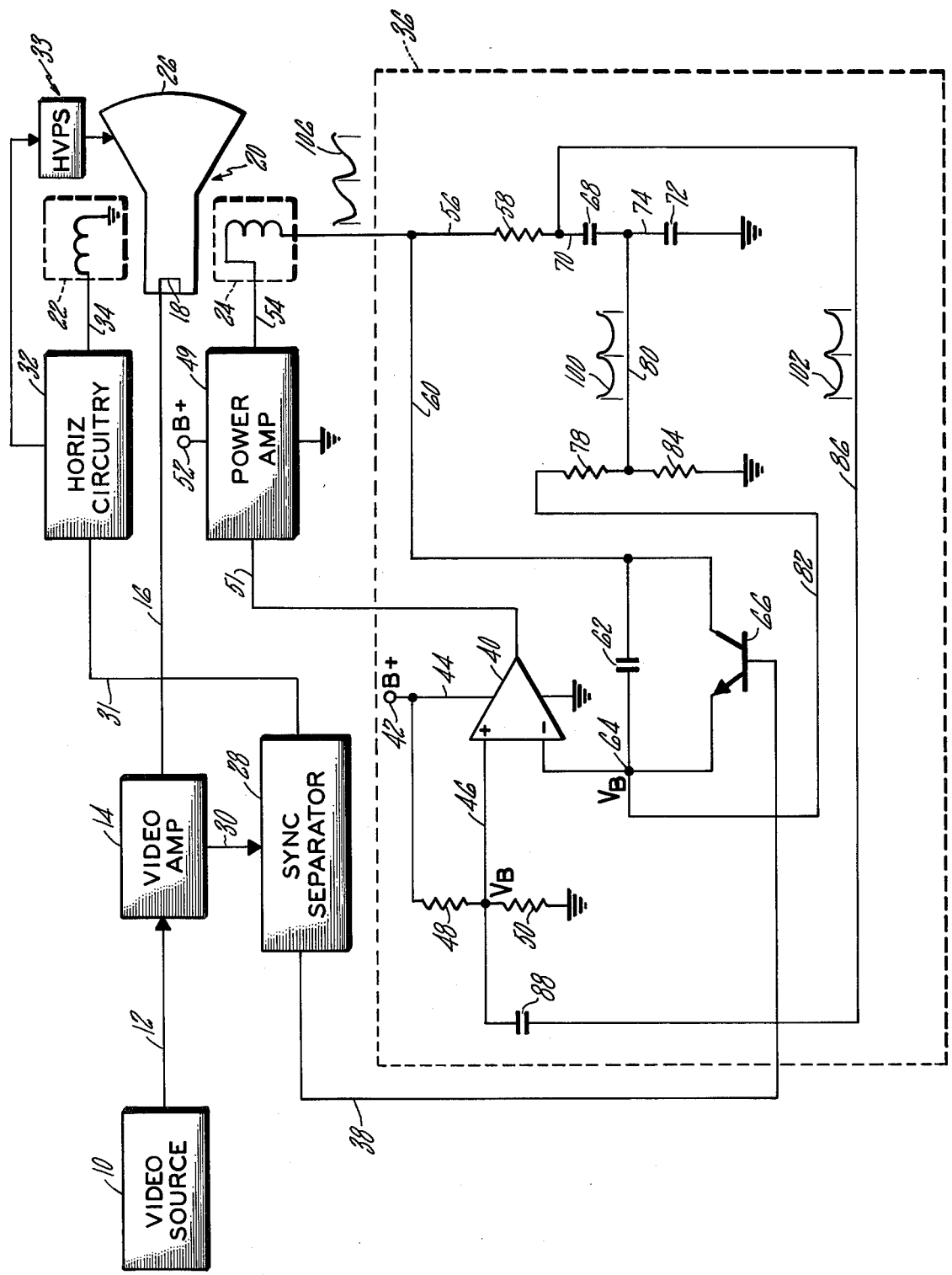

DEFLECTION WAVEFORM GENERATOR

CROSS REFERENCE TO RELATED APPLICATIONS

This is a continuation of application Ser. No. 779,643 filed on Mar. 21, 1977, now abandoned.

BACKGROUND OF THE INVENTION

1. Field of the Invention

This invention relates to a CRT deflection waveform generator, and more particularly, to a circuit for deriving "S" corrected sawtooth current waveform suitable for driving a CRT deflection yoke in a manner to compensate for geometric distortion inherent in flat faceplate CRTs.

2. Description of the Prior Art

It is well known in the utilization of present day cathode tube display devices that a sawtooth waveform is generally utilized to sweep the electron beam both laterally and vertically across the face-plate. However, as is also known, a uniform electron beam sweeping rate is undesirable because typically the present day CRT faceplate is relatively flat so that the center of curvature around the perimeter of the faceplate is different from that at the center of the faceplate. To correct for this form of built in geometric distortion, a nonlinear correction is introduced into the basic sawtooth deflection current waveform. Creating a signal waveform capable of achieving this desired result has been variously known as geometric distortion correction, pin cushion correction, and "S" correction.

Some prior art circuits which correct for this type of distortion in a CRT have involved devices which modulate a signal on the sawtooth deflection current waveform creating a nonlinear waveform which will cause a deviation in the uniform electron beam sweep rate so that the electron beam will move more slowly at wide angles (near the perimeter of the screen) and more rapidly at narrow angles (near the center of the faceplate).

One specific prior art device for generating an "S" corrected sawtooth waveform is disclosed in U.S. Pat. No. 3,725,726 granted Apr. 3, 1973 to R. F. West, in which a first operational amplifier with a capacitive feedback is used to provide the basic sawtooth waveform generator creating a sweep signal to drive a cathode ray tube yoke. A second operational amplifier also strapped by a capacitor integrates the sawtooth waveform to provide a substantially parabolic waveform which is added at the inverting input of the first operational amplifier. This circuit arrangement requires an active element, i.e., a separate operational amplifier, to integrate the sawtooth waveform creating a parabolic waveform which is then fed back to the input of the basic sawtooth waveform generator thus varying the linear nature of the sawtooth waveform. This system provides a high degree of accuracy but at the expense of the use of multiple active integrators.

Another prior art device for "S" shaping a sawtooth waveform is disclosed in U.S. Pat. No. 3,735,192 granted May 22, 1973 to L. R. Avery. A deflection circuit comprises a pair of capacitors connected in a series relationship to a source of constant charging current. A switching device periodically discharges the capacitors creating a linear sawtooth waveform. Linear control and "S" shaping of the sawtooth waveform is provided by a combination of regenerative and degenerative feedback networks coupled between the output circuit and the junction of the series connected capacitors. The feedback circuits add oppositely phased parabolically varying voltages to the sawtooth waveform to provide the same "S" correction for a linear scanning beam sweep. This device does not develop a compensating waveform which corrects the basic sawtooth waveform with a high degree of accuracy.

Of general interest in the generation of a linear sawtooth waveform suitable for use in the vertical deflection circuit of a CRT are the devices disclosed in U.S. Pat. No. 3,890,542 granted June 17, 1975 to G. Zimmerman and U.S. Pat. No. 3,784,857 granted Jan. 8, 1974 to T. J. Christopher. Both of the circuit configurations disclosed in these patents utilize an operational amplifier in which a capacitor is strapped between the inverting input and the output of the amplifier providing a negative feedback signal proportional to the current through the deflection coil. A switch shunting the capacitor is rendered conductive during the retrace interval discharging the integrating capacitor and creating a high voltage across the deflection yoke which retraces the electron beam.

SUMMARY OF THE INVENTION

The object of the present invention is to provide a deflection waveform generator with a minimum number of component parts which provides a high accuracy "S" corrected output signal to the deflection yoke of a CRT which compensates for geometric distortion inherent in flat faceplate CRTs.

According to one feature of the present invention, circuitry is provided which includes an operational amplifier strapped by a capacitor which is periodically shorted creating an integrating feedback to provide the basic sawtooth waveform for driving a CRT deflection yoke. DC isolation is provided by a pair of capacitors connected in series to the yoke resistor while integration of the deflection current waveform to create a parabolic waveform is performed by the more accurate and lower voltage capacitor of the pair. A feedback path connected to the node between the capacitors feeds the parabolic waveform to the inverting input of the balanced operational amplifier integrator so that the basic sawtooth waveform driving the deflection yoke is "S" corrected.

According to a feature of the present invention, a waveform generator for a CRT deflection yoke is disclosed in which the basic sawtooth waveform is corrected for inherent geometric distortion by means of passive elements. The circuit configuration employs a minimal number of component parts rendering it inexpensive to manufacture and long lasting in use. Only one active element, a high gain operational, balanced integrating amplifier is required to create the "S" corrected sawtooth waveform even though the accuracy of correction is comparable with prior art correction circuits employing more than one active element. The deflection current waveform is integrated across an accurate capacitor (the lower voltage capacitor of a pair of series connected deflection yoke capacitors) creating a parabolic waveform which is then fed back to the inverting input of the balanced operational amplifier integrator. The yoke deflection current derived from the amplifier output signal is thus "S" corrected by the integrated parabolic waveform.

Other objects, features and advantages of the present invention will become more apparent from the following detailed description of the preferred embodiment as illustrated in the accompanying drawing.

BRIEF DESCRIPTION OF THE DRAWING

The sole FIGURE herein is a partial schematic diagram of a preferred embodiment of the deflection waveform generator according to the instant invention.

DESCRIPTION OF THE PREFERRED EMBODIMENT

Referring to the drawing, a video source 10 provides a composite video signal including both video display and synchronizing information on line 12 to video amplifier 14 for amplification. The video portion of the composite signal is coupled by a line 16 to the control element 18 of a CRT (cathode ray tube) 20. The CRT 20 is a conventional kinescope used to display visual images, and it is normally employed with a horizontal deflection coil 22 and vertical deflection coil 24 which sweep the modulated electron beam generated by the control element 18 horizontally and vertically, respectively, across the phosphor coating on the inward surface of a CRT faceplate 26.

A sync separator 28 is also coupled to video amplifier 14 by line 30 and receives composite synchronous information containing the horizontal and vertical sync pulses. The horizontal sync signals are coupled via line 31 to horizontal circuitry 32, which develops a line frequency deflection signal waveform at its output. This waveform is coupled to horizontal deflection yoke 22 by line 34 and sweeps the electron beam laterally across the CRT faceplate 26. A high voltage power supply 33 is connected to horizontal circuitry 32 and provides a high voltage DC operating potential, typically 20 kilovolts, to the anode of the CRT 20.

A vertical deflection waveform generator 36 according to the instant invention for generating an output signal to drive the electron beam vertically across the CRT faceplate 26 is coupled by line 38 to sync separator 28. The waveform generator 36 includes an operational amplifier 40 which is a high gain type differential amplifier and has a non-inverting input, an inverting input, and an output. A voltage source 42, is coupled to the power supply terminal of operational amplifier 40 by line 44 and provides operating power, typically 60 volts DC, to drive the amplifier. The non-inverting input of the operational amplifier 40 is connected by line 46 to the mid-point of a voltage divider comprising resistors 48 and 50 biasing the amplifier within its operating range, which may be approximately 40 volts DC. The output of the operational amplifier 40 is connected to a power amplifier 49 by a line 51. The power amplifier 49 may be of the emitter follower type and is driven by a source 52 of operational potential, typically 60 volts DC. At its output terminal a deflection voltage waveform is developed in response to the signal from amplifier 40 suitable for driving a deflection yoke 24. The power amplifier 49 is coupled to one side of vertical deflection yoke 24 by line 54 while the other side of the yoke is connected by line 56 to one side of yoke sense resistor 58.

An integrating feedback path for creating a basic sawtooth waveform is provided via line 60 which is connected to line 56 and to one side of an integrating capacitor 62. The signal waveform developed atop sense resistor 58 is proportional to the current driving deflection yoke 24. The other side of capacitor 62 is coupled to node 64 and the inverting input of the operational amplifier 40. Capacitor 62 is strapped by a switch, transistor 66, which is periodically rendered conductive by the sync pulses supplied to its base from line 38. As indicated hereinbefore, the use of an integrating amplifier strapped by a periodically actuated switch to create a basic sawtooth waveform is known to those of ordinary skill.

According to the present invention, a novel circuit arrangement is provided which eliminates the need for any additional operational amplifier, or other active element, to create a corrected "S" shaped sawtooth deflection current waveform which compensates for geometric distortion in the CRT. As illustrated, the novel circuitry comprises a capacitor 68, providing DC isolation for the yoke current, coupled to one end of the yoke resistor 58 by line 70. One side of a capacitor 72 is connected to the capacitor 68 by line 74 while the other side is shunted to ground. Since a large capacitance is normally required for both capacitor 68 and capacitor 72, polarized electrolytic units are preferably used for this application. Capacitor 68 provides DC isolation for the yoke current and can be selected primarily for its low cost so long as it has at least the necessary capacitance value. Capacitor 72 is selected primarily for accuracy, typically ±10%, which is easy to obtain since it has only a low voltage impressed across it in operation.

A resistor 78 is coupled via line 80 to line 74 and line 82 provides a first feedback path to node 64 and the inverting input of the operational amplifier. A resistor 84 is shunted between line 80 and ground and, together with the resistor 78, provide the basic input current integrated by capacitor 62 and amplifier 40. A second feedback path from line 70 atop the capacitor 68 is provided via line 86 through capacitor 88 and it presents a signal to the non-inverting input of the operational amplifier 40. It is important to note that in accordance with the instant invention, the effective input impedances, to inverting and non-inverting inputs of operational amplifier 40 must be matched, i.e., the respective RC time constants must equal. Accordingly, the capacitor 88 in conjunction with the parallel combination of resistor 48 and 50 should match the time constant of resistor 78 and capacitor 62. This is because in order to create a balanced differential integrator, the impedance to the inverting input from line 80 must equal the impedance to the non-inverting input from line 86 allowing the signals on line 70 and line 80, i.e., the signals on opposite sides of capacitor 68, to vary with respect to ground.

In operation, the basic sawtooth waveform to be applied to vertical deflection yoke 24 is generated by charging the capacitor 62 during the line scan or trace period and discharging it with transistor 66 during the retrace period. At the beginning of each line scan interval, transistor 66 is turned off and the output of the operational amplifier 40 is at approximately the bias $V_b$ established by resistors 48 and 50 which are connected to source 42. Since the operational amplifier 40 has a very high gain, the non-inverting input and the inverting input necessarily are at this same potential if the amplifier is in its unsaturated operating region. Accordingly, this same bias voltage $V_b$ also exists at node 64 and, since the operational amplifier 40 draws practically no current, there is a constant current established by the potential across resistors 78 and 84 through capacitor 62 which, as is known, would create a linearly changing waveform on line 60 but for the introduction of the parabolic waveform as described hereinafter. At the end of each line scan interval, transistor 66 is turned on by a vertical sync pulse delivered to its base over line 38 causing capacitor 62 to discharge very rapidly. This abrupt discharge of capacitor 62 terminates the positive-going ramp on line 60 and causes the current in deflection yoke 24 to suddenly decrease.

According to the present invention, the novel circuit configuration integrates the yoke current on line 56 to form a parabolic waveform which is used to "S" correct the basic sawtooth waveform thus compensating for geometric distortion in the CRT. As can be seen from the drawing, the high current waveform which drives vertical deflection yoke 24 flows through resistor 58, capacitor 68 and capacitor 72 to ground. As is known, the integral of a substantially linear ramp function, such as the yoke current waveform, is a substantially parabolic waveform and the current through capacitor 72 causes such a parabolic voltage waveform to exist on line 80 as indicated by parabolic waveform 100. This signal is then fed back through the first feedback path via resistor 78 and line 82 to node 64 and the inverting input of amplifier 40. A similarly shaped waveform of a slightly greater magnitude is also created on line 70 by the integration of the yoke current through capacitors 68 and 72 and a signal is fed back through the second feedback path via line 86 through the capacitor 88 to the non-inverting input of operational amplifier 40, as illustrated by parabolic waveform 102. Because of the balanced impedances of the first and second feedback paths to the operational amplifier, the signals which appear on line 70, i.e., waveform 102 together with a DC bias component, do not effect the voltage across resistor 58 or the output current yoke 24. Because of the isolation provided by capacitor 68, signals fed back via the first and second feedback paths, other than the parabolic correction waveform, are presented differentially to operational amplifier 40 so that only the signals waveforms on node 64, i.e., a DC component and a parabolic waveform are integrated. It should be noted that the input impedance to the non-inverting input of operational amplifier 40 is formed by capacitor 88 in conjunction with the parallel combination of resistors 48 and 50 and the input impedance to the inverting input is formed by capacitor 62 and resistor 78. The balanced differential nature is required since the deflection current is defined by the voltage across resistor 58 and must be independent of voltage on line 70 which must be present to provide the parabolic correction on line 80.

A particular feature of the present invention is that, in addition to the use of passive elements for integration, the integration of the deflection current providing the parabolic waveform is by a low voltage capacitor with a low energy storage capability while a high voltage capacitor with a large energy storage capacity can be used to provide the DC isolation needed to operate from a single power supply. For example, in the present embodiment capacitor 68 is comparable in value to capacitor 72 and the composite effect is to create a capacitive voltage divider. This allows the parabolic waveform fed to node 64, the waveform whose precise shape controls the correction or non-linearity induced into the basic sawtooth waveform, to be accurately formed by the yoke current through capacitor 72.

Another advantage of the waveform deflection generator according to the instant invention is that a single power supply can be used to power all of the active elements which generate the "S" corrected sawtooth current waveform which is suitable for driving the deflection yoke of a CRT. Accordingly, source 42, driving operational amplifier 40, and source 52, driving current amplifier 49, could, in fact, be a single source rather than multiple power supplies or bipolar power supplies. As will be appreciated by those of ordinary skill, this reduction in the number of power supplies required to drive the present waveform generator is highly desirable since even one less such component can often significantly reduce the overall manufacturing cost of a display system utilizing a CRT.

Although the invention has been shown and described with respect to a preferred embodiment thereof, it should be understood by those skilled in the art that various changes and omissions in the form and detail thereof may be made therein without departing from the spirit and scope of the invention.

Having thus described a typical embodiment of my invention, that which I claim as new and desire to secure by Letters Patent of the United States is:

1. A waveform generator to be used in conjunction with a CRT having a deflection yoke, comprising:
   an operational amplifier means having an inverting and a non-inverting inputs in which the input time constants are substantially equal, and an output from which a signal waveform suitable for driving a CRT deflection yoke can be derived, and further including integrating means coupled to said inverting input for creating a basic sawtooth;
   means coupled to said deflection yoke of said CRT for integrating the current waveform driving said deflection yoke; and
   feedback means having a first path which is connected to said inverting input of said operational amplifier and a second path which is connected to said non-inverting input of said operational amplifier, both paths having substantially equivalent time constants whereby a pair of similarly shaped parabolic waveforms are presented to said inputs of said operational amplifier so that said yoke deflection current waveform is "S" corrected.

2. A waveform generator according to claim 1, wherein said means coupled to said CRT for integrating the current waveform driving said deflection yoke comprises a pair of series connected capacitors through which the yoke deflection current is shunted to ground.

3. A waveform generator according to claim 2, wherein said pair of series coupled capacitors includes a first capacitor having a high energy storage capability and a second capacitor having a lower energy storage capability, and wherein said feedback means is connected across said first capacitor so that the integrated current waveform fed back by said feedback means is derived by the yoke current through said second capacitor.

4. A waveform generator according to claim 3, wherein said first feedback path of said feedback means senses the voltage on said second capacitor and for providing a parabolic waveform to said inverting input, and a second feedback path for providing the voltage waveform across the series combination of said first and second capacitors to said non-inverting input.

* * * * *